(12) United States Patent
Kim et al.

(10) Patent No.: US 9,570,665 B2
(45) Date of Patent: Feb. 14, 2017

(54) POLYAMIDE COMPOSITION HAVING HIGH THERMAL CONDUCTIVITY

(75) Inventors: Tae-Kyun Kim, Gyeonggi-do (KR); Yeong-Chool Yu, Seoul (KR)

(73) Assignee: RHODIA OPERATIONS, Paris (FR)

( * ) Notice: Subject to any disclaimer, the term of this patent is extended or adjusted under 35 U.S.C. 154(b) by 0 days.

(21) Appl. No.: 14/009,882

(22) PCT Filed: Mar. 30, 2012

(86) PCT No.: PCT/EP2012/055821
§ 371 (c)(1),
(2), (4) Date: Oct. 30, 2013

(87) PCT Pub. No.: WO2012/136590
PCT Pub. Date: Oct. 11, 2012

(65) Prior Publication Data
US 2014/0048841 A1    Feb. 20, 2014

(30) Foreign Application Priority Data

Apr. 4, 2011 (FR) .................... 11 52863

(51) Int. Cl.
| | | |
|---|---|---|
| *H01L 33/00* | (2010.01) | |
| *H01L 23/02* | (2006.01) | |
| *H01L 23/16* | (2006.01) | |
| *H01L 23/28* | (2006.01) | |
| *H01L 23/29* | (2006.01) | |
| *C09K 5/00* | (2006.01) | |
| *H01L 33/64* | (2010.01) | |
| *C08K 3/04* | (2006.01) | |
| *C08K 5/00* | (2006.01) | |
| *C08K 5/3492* | (2006.01) | |
| *C08L 77/00* | (2006.01) | |
| *C09K 21/12* | (2006.01) | |
| *C08L 77/06* | (2006.01) | |
| *H05B 33/20* | (2006.01) | |

(52) U.S. Cl.
CPC ................ *H01L 33/64* (2013.01); *C08K 3/04* (2013.01); *C08K 5/0066* (2013.01); *C08K 5/34928* (2013.01); *C08L 77/00* (2013.01); *C08L 77/06* (2013.01); *C09K 21/12* (2013.01); *H05B 33/20* (2013.01)

(58) Field of Classification Search
CPC ..... C08K 5/0066; C08K 5/34928; C08K 3/04; C08L 77/00; C08L 77/06; C09K 21/12; H01L 31/00; H01L 31/0203–31/02168; H01L 33/00; H01L 33/48–33/62; H01L 33/64–33/648; H05B 33/20
USPC ......... 257/99, 100, 678, 683, 787, 788, 789, 257/795; 521/906; 252/71–79, 601–611
See application file for complete search history.

(56) References Cited

U.S. PATENT DOCUMENTS

| | | | | |
|---|---|---|---|---|
| 4,749,736 | A * | 6/1988 | Khanna et al. ................ 524/230 |
| 8,323,837 | B2 * | 12/2012 | Nishida ..................... C08J 5/18 |
| | | | | 428/317.9 |
| 2001/0008484 | A1 * | 7/2001 | Kato et al. .................... 362/267 |
| 2003/0130405 | A1 * | 7/2003 | Takagi et al. ................. 524/495 |
| 2004/0198900 | A1 * | 10/2004 | Madaj ..................... C08G 18/10 |
| | | | | 524/589 |
| 2004/0254270 | A1 | 12/2004 | Harashina ....................... 524/86 |
| 2007/0112082 | A1 * | 5/2007 | Hahn et al. .................... 521/60 |
| 2008/0096988 | A1 * | 4/2008 | Hahn et al. .................... 521/56 |
| 2009/0088353 | A1 * | 4/2009 | Berry et al. .................. 508/388 |
| 2009/0088354 | A1 * | 4/2009 | Berry et al. .................. 508/388 |
| 2012/0129414 | A1 * | 5/2012 | Chang et al. ................. 442/175 |
| 2013/0216799 | A1 * | 8/2013 | Van Dijk .................. B32B 7/02 |
| | | | | 428/212 |
| 2015/0069290 | A1 * | 3/2015 | Guo et al. ....................... 252/75 |
| 2015/0175804 | A1 * | 6/2015 | Aepli ..................... C08L 77/06 |
| | | | | 428/35.7 |
| 2015/0218348 | A1 * | 8/2015 | Tsunaka ................. C08G 69/40 |
| | | | | 524/607 |

FOREIGN PATENT DOCUMENTS

| | | |
|---|---|---|
| DE | 102008038411 A1 | 12/2009 |
| WO | 2006/135841 A1 | 12/2006 |
| WO | 2009/019186 A1 | 2/2009 |

* cited by examiner

Primary Examiner — Teresa M Arroyo

(57) ABSTRACT

The present invention relates to a composition based on a polyamide matrix having a high thermal conductivity and comprising specific proportions of alumina and of graphite and also a flame-retardant system. This composition may in particular be used for producing components for lighting devices comprising light-emitting diodes.

10 Claims, No Drawings

POLYAMIDE COMPOSITION HAVING HIGH THERMAL CONDUCTIVITY

RELATED APPLICATIONS

This application is a U.S. national stage entry under 35 U.S.C. §371 of International Application No. PCT/EP2012/055821, filed Mar. 30, 2012, which claims priority to French Application No. 1152863 filed on Apr. 4, 2011. The entire contents of these applications are explicitly incorporated herein by this reference.

The present invention relates to a composition based on a polyamide matrix exhibiting a high thermal conductivity and comprising specific proportions of alumina and graphite and also a flame-retardant system. This composition can be used in particular to prepare components for lighting devices comprising light-emitting diodes.

PRIOR ART

Polyamide is a synthetic polymer widely used for the manufacture of various articles, such as molded and/or injection-molded parts. Industrial polyamides are used for the preparation of numerous articles in various fields, such as the motor vehicle, electrical or electronics field, where specific properties of stiffness, of impact strength, of dimensional stability, in particular at relatively high temperatures, of surface appearance, of density and of weight are particularly desired. The choice of a material for a given application is generally guided by the level of performance required with regard to certain properties and by its cost. Indeed, novel materials capable of meeting requirements in terms of performance and/or costs are always being sought.

It is known from the prior art to use industrial polyamides exhibiting a good thermal conductivity for various applications, in particular in the electrical and electronics fields, when they are used with semiconductors, engines or components which emit or interact with light. As such, light-emitting diodes (LEDs) are electronic components capable of emitting light when they are traversed by an electrical current, this electrical current generating strong heat which it is then advisable to dissipate in order to prevent hotspots and resulting damage.

It is known to employ components made of polyamide for the preparation of such articles comprising LEDs by using additives capable of increasing the thermal conductivity of the polymer, such as graphite or boron nitride, for example. However, the use of graphite in the polyamide also results in a strong increase in the electrical conductivity, as mentioned in particular in the document FR 2 596 567.

There thus exists a need to devise polyamide-based compositions exhibiting a high thermal conductivity and also a low electrical conductivity, that is to say good electrical insulation, while exhibiting a good compromise in mechanical and flame-retardant properties for various applications.

Furthermore, it was known that alumina, when it is used in very high proportions in the polyamide, makes it possible to confer a degree of thermal conductivity. However, such a proportion of alumina in the matrix causes a drastic deterioration in the mechanical and rheological properties of the polyamide composition.

INVENTION

The applicant company has just demonstrated that the combination of graphite and alumina in specific proportions makes it possible to solve the abovementioned problems and to obtain polyamide compositions exhibiting a high thermal conductivity and also an appropriate electrical conductivity, while exhibiting a good compromise in mechanical and flame-retardant properties.

This is surprising in so far as it was known that graphite makes it possible to increase the thermal and electrical conductivities in the polyamide as explained above and that alumina, when it is used in very high proportions, would make it possible to increase the thermal conductivity without affecting the electrical conductivity.

A first subject matter of the present invention is thus a composition comprising at least:
  a) a polyamide matrix;
  b) from 2% to 30% by weight of alumina;
  c) from 15% to 50% by weight of graphite; and
  d) from 5% to 40% by weight of a flame-retardant system;
the percentages by weight are expressed with respect to the total weight of the composition.

The polyamide matrix preferably comprises a thermoplastic polyamide and more preferably a semicrystalline thermoplastic polyamide. Preference is given in particular to semicrystalline aliphatic or semiaromatic polyamides.

The polyamide of the invention is selected in particular from the group consisting of polyamides obtained by polycondensation of at least one aliphatic dicarboxylic acid with an aliphatic or cyclic or cycloaliphatic or arylaliphatic diamine, such as PA 6.6, PA 6.10, PA 6.12, PA 10.10, PA 10.6, PA 12.12, PA 4.6, MXD 6 or PA 92, or between at least one aromatic dicarboxylic acid and an aliphatic or aromatic diamine, such as polyterephthalamides, polyisophthalamides or polyaramids, or their blend and (co)polyamides. The polyamide of the invention can also be chosen from polyamides obtained by polycondensation of at least one amino acid or lactam with itself, it being possible for the amino acid to be generated by hydrolytic opening of a lactam ring, such as, for example, PA 6, PA 7, PA 11, PA 12 or PA 13, or their blend and (co)polyamides. Mention may in particular be made of polyamide 6/6.6 as type of copolyamide.

Polyamides of type 6 and polyamides of type 6.6 are particularly preferred. Polyamide of type 6 is understood to mean in particular a polyamide comprising at least 90% by weight of caprolactam or aminocaproic monomer residues. Polyamide of type 6.6 is understood in particular to mean a polyamide comprising at least 90% by weight of adipic acid and hexamethylenediamine monomer residues.

The polyamides can exhibit an apparent melt viscosity of between 10 and 1200 Pa·s, measured according to the ISO 11443 standard at a shear rate of 1000 s$^{-1}$ and a temperature of 250° C., in particular for polyamides of type 6; or an apparent melt viscosity of between 10 and 700 Pa·s, measured according to the ISO 11443 standard at a shear rate of 1000 s$^{-1}$ and a temperature of 280° C., in particular for polyamides of type 6.6.

Use may in particular be made of polyamides of variable molecular weights by addition, before or during the polymerization of the polyamide monomers, or else in melt extrusion, of monomers which modify the length of the chains, such as, in particular, difunctional and/or monofunctional compounds exhibiting amine or carboxylic acid functional groups capable of reacting with the monomers of the polyamide or the polyamide.

Carboxylic acid is understood to mean carboxylic acids and their derivatives, such as acid anhydrides, acid chlorides and esters, for example. Amine is understood to mean amines and their derivatives capable of forming an amide bond.

It is possible to use, at the start of, during or at the end of the polymerization, any type of aliphatic or aromatic monocarboxylic or dicarboxylic acid or any type of aliphatic or aromatic monoamine or diamine amine.

Use may very particularly be made of a polyamide obtained at least from adipic acid and hexamethylenediamine or from their salts, such as hexamethylenediamine adipate, which can optionally comprise various proportions of other polyamide monomers. To this end, mention may be made of polyamide 6.6/6.T.

Polyamides according to the invention may also be obtained by blending, in particular melt blending. It is possible, for example, to blend a polyamide with another polyamide, or a polyamide with a polyamide oligomer, or else a polyamide with monomers which modify the length of the chains, such as, in particular, diamines, dicarboxylic acids, monoamines and/or monocarboxylic acids. It is possible, in particular, to add isophthalic acid, terephthalic acid or benzoic acid to the polyamide, for example at contents of approximately 0.2% to 2% by weight.

The composition of the invention can also comprise copolyamides derived in particular from the above polyamides, or blends of these polyamides or (co)polyamides.

Use may also be made of branched polyamides of high melt flow, in particular obtained by blending, during polymerization, in the presence of the polyamide monomers, at least one multifunctional compound comprising at least 3 identical reactive functional groups of amine functional group or carboxylic acid functional group type.

Use may also be made, as polyamide of high melt flow, of a star polyamide comprising star macromolecular chains and, if appropriate, linear macromolecular chains. Polymers comprising such star macromolecular chains are, for example, described in the documents WO97/24388 and WO99/64496.

These star polyamides are in particular obtained by blending, during polymerization, in the presence of the polyamide monomers, an amino acid or lactam, such as caprolactam, at least one multifunctional compound comprising at least 3 identical reactive functional groups of amine functional group or carboxylic acid functional group type. Carboxylic acid is understood to mean carboxylic acids and their derivatives, such as acid anhydrides, acid chlorides and esters, for example. Amine is understood to mean amines and their derivatives capable of forming an amide bond.

The composition can comprise, in addition to the modified polyamide of the invention, one or more other polymers, preferably polyamides or copolyamides. The composition can also comprise, depending on the desired final property, a blend of modified polyamide according to the invention and one or more other polymers, such as, for example, polyamide, polyester, polyolefins, polystyrene, ABS resin, polycarbonate, polyphenylene sulfide, polyphenylene oxide, polyacetal, polysulfone, polyethersulfone, polyetherimide, polyetherketone, a polylactic acid resin, a polysulfone resin, an elastomeric resin or blends of these.

The composition according to the invention can comprise between 20% and 80% by weight, preferentially between 20% and 60% by weight and more preferentially between 25% and 55% by weight of polyamide, with respect to the total weight of the composition.

Alumina or aluminum oxide is a compound of chemical formula $Al_2O_3$ which can be provided in the form of particles having in particular a mean size of between 0.1 and 100 μm. The alumina can in particular exhibit a mean size of less than 50 μm.

The composition according to the present invention preferably comprises from 2% to 20% by weight of alumina, more preferably from 2% to 15% by weight of alumina.

The graphite can be of natural or artificial origin and it can be in the form of flakes, powder, lumps, grains or agglomerates. The size of the graphite particles can be between 0.1 and 100 μm. Mention may in particular be made of the graphite as described in the document Plastics Additives, Hanser Publishers, 4th Edition, 1996.

The graphite can be used as is or in the form of a masterbatch in a resin, for example a polyolefin-based, elastomer-based or phenolic resin.

The composition according to the present invention preferably comprises from 20% to 40% by weight of graphite, more preferably from 20% to 35% by weight of graphite.

The flame-retardant system according to the present invention can comprise flame retardants of any type, that is to say compounds which make it possible to reduce flame propagation and/or which have flame-retardant properties, which are well known to a person skilled in the art. These flame retardants are normally used in flame-retardant compositions and are described in particular, for example, in U.S. Pat. No. 6,344,158, U.S. Pat. No. 6,365,071, U.S. Pat. No. 6,211,402 and U.S. Pat. No. 6,255,371, cited here by way of reference.

Advantageously, the flame-retardant system comprises at least one flame retardant selected from the group consisting of:

phosphorus-comprising flame retardants, such as:
  phosphine oxides, such as, for example, triphenylphosphine oxide, tri(3-hydroxypropyl)phosphine oxide and tri(3-hydroxy-2-methylpropyl)phosphine oxide;
  phosphonic acids or their salts or phosphinic acids or their salts, such as, for example, zinc, magnesium, calcium, aluminum or manganese salts of phosphinic acids, in particular the aluminum salt of diethylphosphinic acid or the zinc salt of dimethylphosphinic acid;
  cyclic phosphonates, such as cyclic diphosphate esters, such as, for example, Antiblaze 1045;
  organic phosphates, such as triphenyl phosphate;
  inorganic phosphates, such as ammonium polyphosphates and sodium polyphosphates;
  red phosphorus, whether, for example, in the stabilized or coated form, as a powder or in the form of masterbatches.
flame retardants of nitrogen-comprising organic compound type, such as, for example, triazines, cyanuric acid and/or isocyanuric acid, melamine or its derivatives, such as melamine cyanurate, melamine oxalate, phthalate, borate, sulfate, phosphate, polyphosphate and/or pyrophosphate, condensed melamine products, such as melem, melam and melon, tri(hydroxyethyl) isocyanurate, benzoguanamine, guanidine, allantoin and glycoluril.
flame retardants comprising halogenated derivatives, such as:
  bromine derivatives, such as, for example, PBDPOs (polybromodiphenyl oxides), BrPS (polybromostyrene and brominated polystyrene), poly-(pentabromobenzyl acrylate), brominated indane, tetradecabromodiphenoxybenzene (Saytex 120), 1,2-bis (pentabromophenyl)ethane or Saytex 8010 from Albemarle, tetrabromobisphenol A and brominated epoxy oligomers. Mention may in particular be made, among brominated derivatives, of polydibromostyrene, such as PDBS-80 from Chemtura, brominated polystyrenes, such as Saytex HP 3010 from Albemarle or FR-803P from Dead Sea Bromine Group, decabromodiphenyl ether (DBPE) or FR-1210 from Dead Sea Bromine Group, octabromodiphenyl ether (OBPE), 2,4,6-tris(2,4,6-tribromophenoxy)-1,3,5-triazine or FR-245 from Dead Sea Bromine Group, poly(pentabromobenzyl acrylate) or FR-1025 from Dead Sea Bromine Group, and epoxy-terminated oligomers or polymers of tetrabromobisphenol A, such as F-2300 and F2400 from Dead Sea Bromine Group.

chlorinated compounds, such as, for example, a chlorinated cycloaliphatic compound, such as Dechlorane Plus® (sold by OxyChem, see CAS 13560-89-9).

The flame-retardant system preferably comprises at least one phosphonic acid or its salt or one phosphinic acid or its salt.

These compounds can be used alone or in combination, sometimes synergistically. Preference is given in particular to a synergistic combination of phosphorus-comprising compounds, such as phosphine oxides, phosphonic acids or their salts or phosphinic acids or their salts, and cyclic phosphonates, with nitrogen-comprising derivatives, such as melam, melem, melamine phosphate, melamine polyphosphates, melamine pyrophosphates or ammonium polyphosphates.

The composition can comprise from 5% to 20% by weight of flame retardants, with respect to the total weight of the composition, in particular in the context of the use of phosphorus-comprising flame retardants, such as phosphinic acids or their salts.

The composition can comprise reinforcing or bulking fillers, such as, for example, fibrous fillers and/or nonfibrous fillers. Mention may be made, as fibrous fillers, of glass fibers, carbon fibers, natural fibers, aramid fibers and nanotubes, in particular carbon nanotubes. Mention may be made, as natural fibers, of hemp and flax. Mention may in particular be made, among nonfibrous fillers, of all particulate or lamellar fillers and/or exfoliable or nonexfoliable nanofillers, carbon black, aluminosilicate clays, montmorillonites, zirconium phosphate, kaolin, calcium carbonate, diatomaceous earths, graphite, mica, silica, titanium dioxide, zeolites, talc, wollastonite, polymeric fillers, such as, for example, dimethacrylate particles, glass beads or glass powder. The concentration by weight of the reinforcing fillers can advantageously be between 1% and 50% by weight, preferably between 15% and 50% by weight, with respect to the total weight of the composition.

The compositions of the invention can also comprise any additive normally used in polyamide-based compositions used for the manufacture of molded or extruded articles. Thus, mention may be made, as examples of additives, of heat stabilizers, U.V. stabilizers, antioxidants, lubricants, pigments, dyes, plasticizers or impact strength modifiers. By way of example, the antioxidants and heat stabilizers are, for example, alkali metal halides, copper halides, sterically hindered phenolic compounds or aromatic amines. The U.V. stabilizers are generally benzotriazoles, benzophenones or HALSs.

There is no limitation on the types of impact strength modifiers. It is generally elastomeric polymers which can be used for this purpose. Examples of suitable elastomers are ethylene/acrylic ester/maleic anhydride copolymers, ethylene/propylene/maleic anhydride copolymers or EPDM (ethylene/propylene/diene monomer) copolymers with optionally a grafted maleic anhydride. The concentration by weight of elastomer is advantageously between 0.1% and 15%, with respect to the total weight of the composition.

The compositions of the invention are obtained by blending the various constituents, generally in a single- or twin-screw extruder, at a temperature sufficient to keep the polyamide resin as a molten medium. Generally, the blend obtained is extruded in the form of rods which are cut into pieces in order to form granules. The additives, such as graphite and alumina, can be added, together or separately, to the polyamide by blending under hot conditions or under cold conditions.

The addition of the compounds and additives can be carried out by addition of these compounds to the molten polyamide in the pure form or in the form of a concentrated blend in a resin, such as, for example, a polyamide resin.

The granules obtained are used as starting material to feed processes for the manufacture of articles, such as injection, injection molding, extrusion and extrusion-blow molding processes. The article according to the invention can in particular be an extruded or injected article.

The invention also relates to articles obtained by shaping the composition of the invention, by any plastic transformation technique, such as, for example, by extrusion, such as, for example, extrusion of sheets and films or extrusion-blow molding; by molding, such as, for example, compression molding, thermoforming molding or rotational molding; or by injection, such as, for example, injection molding or injection-blow molding.

Thus, the composition of the invention is particularly suitable for the manufacture of articles used in the field of electrical or electronic connections, such as components of circuit breakers, switches, connectors or the like.

The composition according to the invention is particularly suitable for the manufacture of components associated with light-emitting diodes, such as packages, housings, supports, reflectors, cases, lids, sockets, bases or others, or of components associated with semiconductors or other in which the component makes it possible to discharge the amount of heat given off by the light-emitting diodes in operation. These components are particularly manufactured by shaping the composition according to the invention by extrusion, molding or injection.

Another subject matter of the present invention is a lighting device comprising at least one light-emitting diode and one component obtained from a polyamide composition as described above. The invention relates in particular to a diode lamp or semiconductor light-emitting source comprising at least one light-emitting diode and one component obtained from a polyamide composition as described above. Preferably, the LEDs are high-power LEDs, each with a power of greater than 10 W. The LEDs are preferably produced on one and the same wafer of semiconductor material.

A specific language is used in the description so as to facilitate understanding of the principle of the invention. Nevertheless, it should be understood that no limitation on the scope of the invention is envisaged by the use of this specific language. Modifications and improvements can in particular be envisaged by a person conversant with the technical field concerned on the basis of his own general knowledge.

The term and/or includes the meanings and, or and all the other possible combinations of the elements connected to this term.

Other details or advantages of the invention will become more clearly apparent in the light of the examples given below purely by way of indication.

EXPERIMENTAL PART

Example 1

Preparation of the Compositions

Compounds used:
Polyamide 6.6 with a relative viscosity of 2.7 (according to the standard ISO 307, using sulfuric acid as solvent), sold by Rhodia Engineering Plastics under the name Technyl® 27 A00.
Masterbatch: 20% by weight phenol-formaldehyde/80% by weight graphite
Alumina (aluminum oxide) KAM
OCV 983 Glass fiber from Owens Corning Vetrotex
Flame-retardant system: Exolit® OP1230 from Clariant and melamine polyphosphate Melapur® 200
Formulation additives: heat stabilizers and lubricants. 0.2% by weight in all the formulations.

In order to manufacture compositions comprising varied proportions of additives and filler, the polyamide and the various additives are blended by extrusion, via a twin-screw extruder (barrel temperature: 250-290° C., flow rate: 30 kg/h, rotation: 250 rpm). The final compositions are then extruded and granulated, and then injection molded. The results are given in table 1.

TABLE 1

| Composition | C1 | C2 | C3 | C4 | 1 | 2 |
|---|---|---|---|---|---|---|
| PA 6.6 | 84.3 | 39.9 | 65.9 | 31.9 | 35.9 | 45.3 |
| Graphite MB | — | 30.0 | — | — | 30.0 | 30.0 |
| Alumina | — | — | 4.0 | 38.0 | 4.0 | 9.0 |
| GF | 5.0 | 5.0 | 5.0 | 5.0 | 5.0 | 5.0 |
| Exolit | 7 | 16.6 | 16.6 | 16.6 | 16.6 | 7 |
| MPP | 3.5 | 8.3 | 8.3 | 8.3 | 8.3 | 3.5 |
| Surface resistivity (log ohm square) | 15 | 6 | 15 | 15 | 8 | 9 |
| Thermal conductivity (W/mK) | 0.1 | 1.5 | 0.5 | 1.0 | 3.0 | 3.0 |
| UL 94 @ 0.8 mm | V2 | V0 | V0 | V0 | V0 | V1 |
| Ultimate bending strength (kgf/cm$^2$) | 1390 | 830 | 1170 | 830 | 980 | 1020 |
| Flexural modulus (kgf/cm$^2$) | 45 000 | — | 42 300 | — | — | 69 000 |
| Izod impact 6.4 t (kgf cm/cm) | 3.8 | 2.0 | 3.0 | 1.0 | 1.8 | 2.5 |
| HDT (18.5 kgf/cm$^2$) | 230 | 208 | 202 | 208 | 201 | 215 |

The proportions are expressed as percentage by weight, with respect to the total weight of the composition The measurements were carried out with the following standards:
Izod impact strength according to the standard ASTM D-256
Ultimate bending strength and flexural modulus according to the standard ASTM D638
Surface resistivity according to the standard ASTM D257 (Standard Test Methods for DC Resistance or Conductance of Insulating Materials)
Thermal conductivity according to the standard ASTM E1461 (Standard Test Method for Thermal Diffusivity by the Flash Method)

It is thus observed that the combination according to the invention of high proportions of graphite and of low proportions of alumina in the polyamide composition makes it possible to obtain a unique compromise in mechanical, resistivity to electrical current and thermal conductivity properties which renders this composition suitable for the manufacture of articles for applications related to semiconductors or light-emitting diodes.

The invention claimed is:
1. A composition comprising:
 a) a polyamide matrix;
 b) from 2% to 30% by weight of alumina;
 c) from 15% to 50% by weight of a natural or artificial graphite having a particle size of from 0.1 to 100 μm; and
 d) from 5% to 40% by weight of a flame-retardant system;
 wherein the percentages by weight are expressed with respect to the total weight of the composition.
2. The composition as claimed in claim 1, wherein the composition comprises from 20% to 80% by weight of polyamide, with respect to the total weight of the composition.
3. The composition of claim 1, wherein the composition comprises from 2% to 20% by weight of alumina.
4. The composition of claim 1, wherein the composition comprises from 20% to 40% by weight of graphite.
5. The composition of claim 1, wherein the flame-retardant system comprises at least one flame retardant selected from the group consisting of: phosphorus-comprising flame retardants, flame retardants of nitrogen-comprising organic compound type and flame retardants comprising halogenated derivatives.
6. The composition of claim 1, wherein the flame-retardant system comprises at least one phosphonic acid or its salt or one phosphinic acid or its salt.
7. The composition of claim 1, wherein the composition further comprises reinforcing or bulking fillers.
8. The composition of claim 1, wherein the composition comprises:
 from 2% to 15% by weight of the alumina;
 from 20% to 35% by weight of the graphite; and
 from 5% to 20% by weight of the flame-retardant system.
9. The composition of claim 1, wherein the composition exhibits a thermal conductivity of from greater than 0.1 W/mK to 3.0 W/mK.
10. The composition of claim 1, wherein the composition exhibits a thermal conductivity of 3.0 W/mK.

* * * * *